(12) United States Patent
Morgan et al.

(10) Patent No.: US 7,266,135 B2
(45) Date of Patent: Sep. 4, 2007

(54) METHOD FOR PRODUCING LASER WITH RESONANT REFLECTOR

(75) Inventors: Robert A. Morgan, Plymouth, MN (US); Eva M. Strzelecki, Plymouth, MN (US)

(73) Assignee: Finisar Corporation, Sunnyvale, CA (US)

( * ) Notice: Subject to any disclaimer, the term of this patent is extended or adjusted under 35 U.S.C. 154(b) by 111 days.

(21) Appl. No.: 10/819,654

(22) Filed: Apr. 7, 2004

(65) Prior Publication Data

US 2004/0191941 A1    Sep. 30, 2004

Related U.S. Application Data

(62) Division of application No. 09/751,423, filed on Dec. 29, 2000, now Pat. No. 6,727,520.

(51) Int. Cl.
*H01S 3/098* (2006.01)
(52) U.S. Cl. .......................................... 372/19; 257/98
(58) Field of Classification Search ................. 372/19; 257/98
See application file for complete search history.

(56) References Cited

U.S. PATENT DOCUMENTS

| | | | |
|---|---|---|---|
| 4,317,085 A | 2/1982 | Brunham et al. |
| 4,466,694 A | 8/1984 | MacDonald |
| 4,660,207 A | 4/1987 | Svilans |
| 4,784,722 A | 11/1988 | Liau et al. |
| 4,885,592 A | 12/1989 | Kofol et al. |
| 4,901,327 A | 2/1990 | Bradley |
| 4,943,970 A | 7/1990 | Bradley |
| 4,956,844 A | 9/1990 | Goodhue et al. |
| 5,031,187 A | 7/1991 | Orenstien et al. |
| 5,034,958 A | 7/1991 | Kwon et al. |

(Continued)

FOREIGN PATENT DOCUMENTS

DE         4 240 706         6/1994

(Continued)

OTHER PUBLICATIONS

Morgan et al. ("Hybrid dielectric / AlGaAs mirror spatially filtered vertical cavity top-surface emitting laser," APL vol. 66, No. 10, Mar. 1995, pp. 1157-1159).*

(Continued)

*Primary Examiner*—Minsun Oh Harvey
*Assistant Examiner*—Tod T. Van Roy
(74) *Attorney, Agent, or Firm*—Workman Nydegger

(57) ABSTRACT

In one exemplary embodiment of the invention, a method is employed that is directed to forming a resonant reflector on an optoelectronic device, such as a semiconductor laser for example. The exemplary method involves depositing a first material layer on the top layer of the optoelectronic device, where the first material layer having a refractive index and a thickness of about an odd multiple of a quarter of a wavelength to which the optoelectronic device is tuned. A patterned region is then created that extends at least partially into the first material layer. Selected patterned regions are at least partially filled with a second material that has a refractive index that is greater than the refractive index of the first material layer. Finally, a third layer, having a refractive index greater than the refractive index of the first material layer, is deposited immediately adjacent the first material layer.

17 Claims, 12 Drawing Sheets

U.S. PATENT DOCUMENTS

| | | | |
|---|---|---|---|
| 5,052,016 A | 9/1991 | Mahbobzadeh et al. | |
| 5,056,098 A | 10/1991 | Anthony et al. | |
| 5,062,115 A | 10/1991 | Thornton | |
| 5,068,869 A | 11/1991 | Wang et al. | |
| 5,115,442 A | 5/1992 | Lee et al. | |
| 5,140,605 A | 8/1992 | Paoli et al. | |
| 5,158,908 A | 10/1992 | Blonder et al. | |
| 5,216,263 A | 6/1993 | Paoli | |
| 5,216,680 A | 6/1993 | Magnusson et al. | |
| 5,237,581 A | 8/1993 | Asada et al. | |
| 5,245,622 A | 9/1993 | Jewell et al. | |
| 5,258,316 A | 11/1993 | Ackley et al. | |
| 5,258,990 A | 11/1993 | Olbright et al. | |
| 5,285,466 A | 2/1994 | Tabatabaie | |
| 5,293,392 A | 3/1994 | Shieh et al. | |
| 5,317,170 A | 5/1994 | Paoli | |
| 5,317,587 A | 5/1994 | Ackley et al. | |
| 5,325,386 A | 6/1994 | Jewell et al. | |
| 5,331,654 A | 7/1994 | Jewell et al. | |
| 5,337,074 A | 8/1994 | Thornton | |
| 5,349,599 A | 9/1994 | Larkins | |
| 5,351,256 A | 9/1994 | Schneider et al. | |
| 5,359,447 A | 10/1994 | Hahn et al. | |
| 5,359,618 A | 10/1994 | Lebby et al. | |
| 5,363,397 A | 11/1994 | Collins et al. | |
| 5,373,520 A | 12/1994 | Shoji et al. | |
| 5,404,373 A | 4/1995 | Cheng | |
| 5,416,044 A | 5/1995 | Chino et al. | |
| 5,428,634 A | 6/1995 | Bryan et al. | |
| 5,446,754 A | 8/1995 | Jewell et al. | |
| 5,475,701 A | 12/1995 | Hibbs-Brenner | |
| 5,513,202 A | 4/1996 | Kobayashi et al. | |
| 5,530,715 A | 6/1996 | Shieh et al. | |
| 5,555,255 A | 9/1996 | Kock et al. | |
| 5,557,626 A | 9/1996 | Grodinski et al. | |
| 5,561,683 A | 10/1996 | Kwon | |
| 5,568,499 A | 10/1996 | Lear | |
| 5,574,738 A | 11/1996 | Morgan | |
| 5,598,300 A * | 1/1997 | Magnusson et al. | 359/566 |
| 5,606,572 A | 2/1997 | Swirhun et al. | |
| 5,642,376 A | 6/1997 | Olbright et al. | |
| 5,727,013 A | 3/1998 | Botez et al. | |
| 5,774,487 A | 6/1998 | Morgan | |
| 5,818,066 A | 10/1998 | Duboz | |
| 5,838,715 A | 11/1998 | Corzine et al. | |
| 5,903,590 A | 5/1999 | Hadley et al. | |
| 5,940,422 A | 8/1999 | Johnson | |
| 5,978,401 A | 11/1999 | Morgan | |
| 6,026,111 A | 2/2000 | Jian et al. | |
| 6,055,262 A | 4/2000 | Cox et al. | |
| 6,078,601 A | 6/2000 | Smith | |
| 6,144,682 A | 11/2000 | Sun | |
| 6,185,241 B1 | 2/2001 | Sun | |
| 6,215,928 B1 * | 4/2001 | Friesem et al. | 385/37 |
| 6,238,944 B1 | 5/2001 | Floyd | |
| 6,411,638 B1 | 6/2002 | Johnson et al. | |
| 6,727,520 B2 | 4/2004 | Morgan et al. | |
| 6,878,958 B2 | 4/2005 | Zhu | |
| 2004/0188695 A1 | 9/2004 | Morgan et al. | |

FOREIGN PATENT DOCUMENTS

| | | |
|---|---|---|
| EP | 0 288 184 | 10/1988 |
| EP | 0 712 182 | 5/1996 |
| EP | 0 776 076 | 5/1997 |
| FR | 2 768 566 | 3/1999 |
| JP | 60-123084 | 7/1985 |
| JP | 02-054981 | 2/1990 |
| JP | 5-299779 | 11/1993 |
| JP | 2000-330124 | 11/2000 |
| WO | WO99/31735 | 6/1999 |
| WO | WO 00/45483 | 8/2000 |

OTHER PUBLICATIONS

International Search Report, dated Mar. 12, 2003, relative to PCT Application No. PCT/US 01/50214, the foreign equivalent to the instant U.S. Appl. No. 09/751,423.

Banwell, et al., "VCSE laser Transmitters for Parallel Data Links," *IEEE Journal of Quantum Electronics*, vol. 29, No. 2, Feb. 1993, pp. 635-644.

Catchmark, et al., "High Temperature CW Operation of Vertical Cavity Top Surface-Emitting Lasers," CLEO 1993, p. 138.

Jewell, et al., "Surface Emitting Microlasers for Photonic Switching & Intership Connections," *Optical Engineering*, vol. 29, No. 3, Mar. 1990, pp. 210-214.

Lehman, et al., "High Frequency Modulation Characteristics of Hybrid Dielectric/AlGaAs Mirror Singlemode VCSELs," *Electronic Letters*, vol. 31, No. 15, pp. 1251-1252, Jul. 20, 1995.

Morgan, et al., Hybride Dielectric/AlGaAs Mirror Spatially Filtered Vertical Cavity Top-Surface Emitting Laser, *Applied Physics Letters*, vol. 66, No. 10, Mar. 6, 1995, pp. 1157-1559.

Morgan, et al., "Transverse Mode Control of Vertical-Cavity Top-Surface Emitting lasers," *IEEE Photonics Technology Letters*, vol. 4, No. 4, Apr. 1993, pp. 374-377.

U.S. Appl. No. 09/751,422, filed Dec. 29, 2000, entitled "Resonant Reflector for Use with Optoelectronic Devices."

Guenter, et al., "Reliability of Proton-Implanted VCSELs for Data Communications," Invited Paper, *SPIE*, Vo., 2683, OE LASE 96, Photonics West: Fabrication, Testing and Reliability of Semiconductors Lasers,, (SPIE, Bellingham, WA 1996).

Hibbs-Brenner, et al., "Performance, Uniformity and Yield of 850nm VCSELs Deposited by MOVPE," *IEEE Photonics Technology Letters*, vol. 8, No. 1, Jan. 1996, pp. 7-9.

Hornak, et al., "Low-Temperature (10K-300K0 Characterization of MOVPE-Grown Vertical-Cavity Surface-Emitting Lasers," *Photonics Technology Letters*, vol. 7, No. 10, Oct. 1995, pp. 1110-1112.

Huffaker, et al., "Lasing Characteristics of Low Threshold Microcavity Layers Using Half-Wave Spacer Layers and Lateral Index Confinement," *Applied Physics Letters*, vol. 66, No. 14, Apr. 3, 1995, pp. 1723-1725.

K. L. Lear, et al., "Selectively Oxidized Vertical Cavity Surface-Emitting Lasers with 50% Power Conversion Efficiency," *Electronic Letters*, vol. 31, No. Feb. 2, 1995, pp. 208-209.

Magnusson, "Integration of Guided-Mode Resonance Filters and VCSELs," Electo-Optics Research Center, Department of Electrical Engineering, University of Texas at Arlington, May 6, 1997.

Morgan, et al. "One Watt Vertical Cavity Surface Emitting Laser," *Electronic Letters*, vol. 29, No. 2, Jan. 21, 1993, pp. 206-207.

Morgan, et al., "Producible Ga-AS-based MOVPE-Grown Vertical-Cavity Top-Surface Emitting Lasers with Record Performance." *Elec. Lett.*, vol. 31, No. 6, pp. 462-464, Mar. 16, 1995.

Morgan, et al., "Spatial-Filtered Vertical-Cavity Top Surface-Emitting Lasers," CLEO, 1993, pp. 138-139.

Morgan, et al., "Vertical Cavity Surface Emitting Laser Arrays: Come of Age," Invited Paper, *SPIE*, vol. 2683, 0-8194-2057-3/96, pp. 18-29.

S.S. Wang and R. Magnusson, "Multilayer Waveguide-Grating Filters," *Appl. Opt.*, vol. 34, No. 14, pp. 2414-2420, 1995, May 1995.

S.S. Wang and R. Magnusson, "Theory and Applications of Guided-Mode Resonance Filters," *Appl. Opt.*, vol. 32, No. 14, pp. 2606-2613, 1993.

Y. M. Yang, et al., "Ultralow Threshold Current Vertical Cavity Surface Emitting Lasers Obtained with Selective Oxidation," *Electronic Letter*, vol. 31, No. 11, Mary 25, 1995, pp. 886-888.

Yablonovitch, et al., "Photonic Bandgap Structures," *J. Opt. Soc. Am. B.*, Bill-of-lading. 10, No. 2, Feb. 1993, pp. 283-295.

Young, et al., "Enhanced Performance of Offset-Gain High Barrier Vertical-Cavity Surface-Emitting Lasers," *IEEE J. Quantum Electronic*, vol. 29, No. 6, Jun. 1993, pp. 2013-20222.

Smith, et al., Polarization-Sensitive Subwavelength Antireflection Surfaces on a Semiconductor for 975 NM, *Optics Letters*, vol. 21, No. 15, Aug. 1, 1996, pp. 1201-1203.

Suning Tang, et al., "Design Limitations of Highly Parallel Free-Space Optical Interconnects Based on Arrays of Vertical Cavity Surface-Emitting Laser Diodes, Microlenses, and Photodetectors," *Journal of Lightwave Technology*, vol. 12, No. 11, Nov. 1, 1994, pp. 1971-1975.

Cox, et al., "Guided Mode Grating Resonant Filters of VCSEL Applications," *Proceedings of the SPIE*, The International Society for Optical Engineering, Diffractive, and Holographic Device Technologies and Applications V, San Jose, California, vol. 3291, Jan. 28-29, 1998, pp. 70-71.

Martinsson, et al., "Transverse Mode Selection in Large-Area Oxide-Confined Vertical-Cavity Surface-Emitting Lasers Using A Shallow Surface Relief," *IEEE Photonics Technology Letters*, vol. 11, No. 12, Dec. 1999, pp. 1536-1538.

Choquette, eel al., "Lithographically-Defined Gain Apertures Within Selectively Oxidized VCSELs," paper CtuL6, Conference on Lasers and Electro-Optics, San Francisco, California (2000).

Oh, et la. "Single-Mode Operation in Antiquided Vertical-Cavity Surface-Emitting Laser Using a Low-Temperature Grown AlGaAs Dielectric Aperture," *IEEE Photonics Technology Letters*, 10(8), 1064-1066 (1998).

Jewell, et al., "Surface-Emitting Microlasers for Photonic Switching and Interchip Connections," *Optical Engineering*, vol. 29, No., Mar. 1990, pp. 210-214.

G. Shtengel, et al., "High-Speed Vertical-Cavity Surface-Emitting Lasers," *Photonics Technology Letters*, vol. 5, No. 12, Dec. 1993, pp. 1359-1361.

Chemla, et al., "Nonlinear Optical Properties of Semiconductor quantum Wells," *Optical Nonlinearities and Instabilities in Semiconductors*, Academic Press, Inc., copyright 1988, pp. 83-120. (PDF Attachment Article 1).

Choa, et al., "High-Speed Modulation of Vertical-Cavity Surface-Emitting Lasers," *IEEE Photonics Technology Letters*, vol. 3, No. 8, Aug. 1991, pp. 691-699. (PDF Attachment Article 2).

G.G. Oritz, et. Al., "Monolithic Integration of In0.2GA0.8AS Vertical Cavity Surface-Emitting Lasers with Resonance Enhanced Quantum Well Photodetectors," *Electronics Letters*, vol. 32, No. 13, Jun. 20, 1996, pp. 1205-1207. (PDF Attachment Article 3).

Graf, Rudolph, *Modern Dictionary of Electronics*, 6th ed., Indiana: Howard W. Sams & Company, 1984, p. 694. (PDF Attachment Article 4).

Kishino, et al., "Resonant Cavity-Enhanced (RCE) Photodetectors" *IEEE Journal of Quantum Electronics*, vol. 27, No. 8, pp. 2025-2034. (PDF Attachment Article 5).

Kuchibhotla, et al., "Low-Voltage High Gain Resonant—Cavity Avalanche Photodiode," *IEEE Photonics Technology Letters*, vol. 3, No. 4, Apr. 19, 1991, pp. 354-356. (PDF Attachment Article 6).

Lai, et al., "Design of a Tunable GaAs/AlgaAs Multiple-Quantum—Well Resonant Cavity Photodetector," *IEEE Journal of Quantum Electronics*, vol. 30, No. 1, Jan. 1994, pp. 108-114. (PDF Attachment Article 7).

Lee, et al., "Top-Surface Emitting GaAS Four—Quantum—Well Lasers Emitting at 0-85 um," *Electronics Letters*, vol. 24, No. 11, May 24, 1990, pp. 710-711. (PDF Attachment Article 8).

Miller, et al., Optical Bistaqbility Due to Increasing Absorption,: *Optics Letters*, vol. 9, No. 5, May 1984, pp. 162-164. (PDF Attachment Article 9).

Morgan, et al., "200 C, 96-nm Wavelength Range, Continuous-Wave Lasing from Unbonded GaAs MOVEPE-Grown Vertical Cavity Surface-Emitting Lasers," *IEEE Photonics Technology Letters*, vol. 7, No. 5, May 1995, pp. 441-443. (PDF Attachment Article 10).

Jiang, et al., "High-Frequency Polarization Self-Modulation in Vertical-Cavity Surface-Emitting Lasers," *Applied Physics Letters*, vol. 63, No. 63, Dec. 27, 1993, pp. 2545-2547. (PDF Attachment Article 11).

Morgan, et al., "High-Power Coherently Coupled 8×8 Vertical Cavity Surface Emitting Laser Array," *Applied Physics Letter*, vol. 61, No. 10, Sep. 7, 1992, pp. 1160-1162. (PDF Attachment Article 12).

Morgan, et al., "Novel Hibrid-DBR Single-Mode Controlled GaAs Top-Emitting VCSEL with Record Low Voltage," 2 pages, date prior to Dec. 29, 2000. (PDF Attachment Article 13).

Morgan, et al., Progress in Planarized Vertical Cavity Surface Emitting Laser Devices and Arrays, *SPIE*, vol. 1562, Jul. 1991, pp. 149-159. (PDF Attachment Article 14).

Morgan, et al., "Submilliamp, Low-Resistance, Continuous-Wave, Single-Mode GaAs Planar Vertical-Cavity Surface Emitting Lasers," Honeywell Technology Center, Jun. 6, 1995. (PDF Attachment Article 15).

Morgan, et al., "Vertical-Cavity Surface-Emitting Laser Arrays," *SPIE*, vol. 2398, Feb. 1995, pp. 65-93. (PDF Attachment Article 16).

Morgan, "High-Performance, Producible Vertical Cavity Lasers for Optical Interconnects," *High Speed Electronics and Systems*, vol. 5, No. 4, Dec. 1994, pp. 65-95. (PDF Attachment Article 17).

Nugent, et al., "Self-Pulsations in Vertical-Cavity Surface-Emitting Lasers," *Electronic Letters*, vol. 31, No. 1, Jan. 5, 1995, pp. 43-44. (PDF Attachment Article 18).

US 5,778,078, 07/1998, Yoshikawa et al. (withdrawn)

* cited by examiner

METHOD FOR PRODUCING LASER WITH RESONANT REFLECTOR

CROSS-REFERENCE TO RELATED APPLICATIONS

This application is a division, and claims the benefit, of U.S. patent application Ser. No. 09/751,423, now U.S. Pat. No. 6,727,520 entitled SPATIALLY MODULATED REFLECTOR FOR AN OPTOELECTRONIC DEVICE, filed Dec. 29, 2000, and incorporated herein in its entirety by this reference.

BACKGROUND OF THE INVENTION

Field of the Invention

This invention generally relates to methods for producing optoelectronic components such as semiconductor lasers. More particularly, embodiments of the invention are concerned with methods for producing a resonant reflector for use in facilitating mode control in optoelectronic components.

BRIEF SUMMARY OF AN EXEMPLARY EMBODIMENT OF THE INVENTION

In one exemplary embodiment of the invention, a method is employed that is directed to forming a resonant reflector on an optoelectronic device, such as a semiconductor laser for example. The exemplary method involves depositing a first material layer on the top layer of the optoelectronic device, where the first material layer having a refractive index and a thickness of about an odd multiple of a quarter of a wavelength to which the optoelectronic device is tuned. Next, a patterned region is created that extends at least partially into the first material layer. Selected patterned regions are then at least partially filled with a second material that has a refractive index that is greater than the refractive index of the first material layer. Finally, a third layer, having a refractive index greater than the refractive index of the first material layer, is deposited immediately adjacent the first material layer. In this way, a resonant reflector for facilitating mode control is formed on a device such as a semiconductor laser without necessitating significant additional processing and manufacturing steps.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
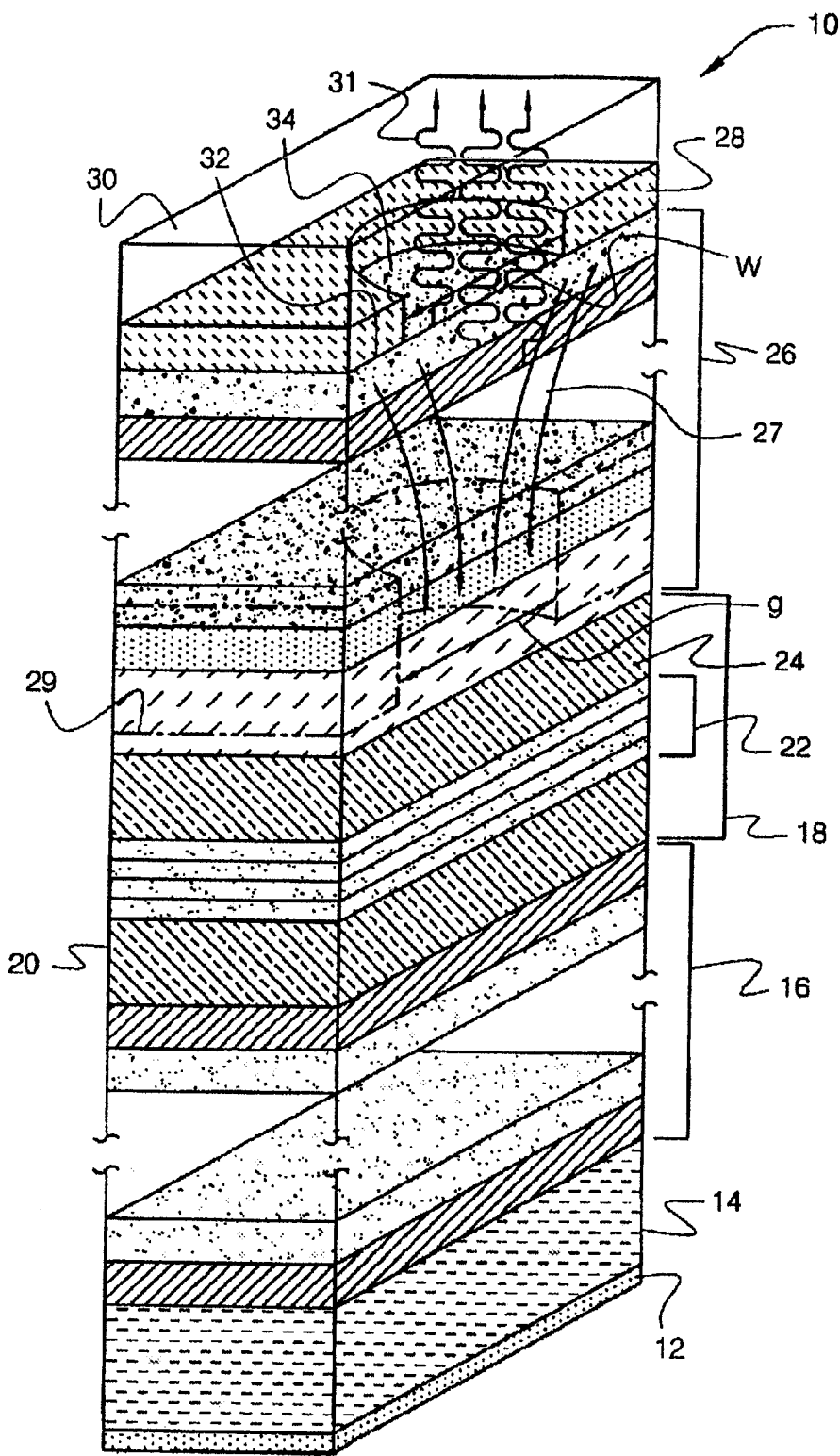
FIG. 1 is a schematic diagram of a planar, current-guided, GaAs/AlGaAs top surface emitting vertical cavity laser in accordance with the prior art.

FIG. 1 is a schematic illustration of a planar, current-guided, GaAs/AlGaAs top surface emitting vertical cavity laser 10 in accordance with the prior art. Formed on an n-doped gallium arsenide (GaAs) substrate 14 is an n-contact 12. Substrate 14 is doped with impurities of a first type (i.e., n type). An n-type mirror stack 16 is formed on substrate 14. Formed on stack 16 is a spacer 18. Spacer 18 has a bottom confinement layer 20 and a top confinement layer 24 surrounding active region 22. A p-type mirror stack 26 is formed on top confinement layer 24. A p-metal layer 28 is formed on stack 26. The emission region may have a passivation layer 30.

Isolation region 29 restricts the area of the current flow 27 through the active region. Region 29 may be formed by deep H+ ion implantation. The diameter "g" may be set to provide the desired active area, and thus the gain aperture of the VCSEL 10. Further, the diameter "g" may be set by the desired resistance of the p-type mirror stack 26, particularly through the non-conductive region 29. Thus, non-conductive region 29 performs the gain guiding function. The diameter "g" is typically limited by fabrication limitations, such as lateral straggle during the implantation step.

Spacer 18 may contain a bulk or quantum-well active region disposed between mirror stacks 16 and 26. Quantum-well active region 22 may have alternating layers of aluminum gallium arsenide (AlGaAs) barrier layers and GaAs quantum-well layers. InGaAs quantum wells may also be used in the active region, particularly where an emission wavelength (e.g. $\lambda$=980 nm) is desired where GaAs is transparent. Stacks 16 and 26 are distributed Bragg reflector (DBR) stacks, and may include periodic layers of doped AlGaAs and aluminum arsenide (AlAs). The AlGaAs of stack 16 is doped with the same type of impurity as substrate 14 (e.g., n type), and the AlGaAs of stack 26 is doped with the other kind of impurity (e.g., p type).

Metal contact layers 12 and 28 are ohmic contacts that allow appropriate electrical biasing of laser diode 10. When laser diode 10 is forward biased with a more positive voltage on contact 28 than on contact 12, active region 22 emits light 31 which passes through stack 26.

Most VCSELs of practical dimensions are inherently multi (transverse) mode. Single lowest-order mode VCSELs are favored for coupling into single-mode fibers, and are advantageous for free-space and/or wavelength sensitive systems, and may even be beneficial for use in extending the bandwidth-length product of standard 50 µm and 62.5 µm GRIN multi-mode fiber. However, it has long been known that, although the short optical cavity (2 λ) of the VCSEL favors single longitudinal mode emission, the multi-wavelength (10 λ) lateral dimensions facilitate multi-transverse mode operation.

As indicated above, higher order modes typically have a greater lateral concentration of energy away from the center of the optical or lasing cavity. Thus, the most obvious way to force the laser to oscillate in only a lowest order circularly symmetric mode is to make the lateral dimension "g" of the active area small enough to prevent higher-order modes from reaching threshold. However, this necessitates lateral dimensions of less than about 5 µm for typical VCSELs. Such small areas may result in excessive resistance, and push the limits obtainable from conventional fabrication methodologies. This is particularly true for implantation depths of greater than about 1 µm, where lateral straggle may become a limiting factor. Thus, control of transverse modes remains difficult for VCSEL's of practical dimensions.

Figure 2:
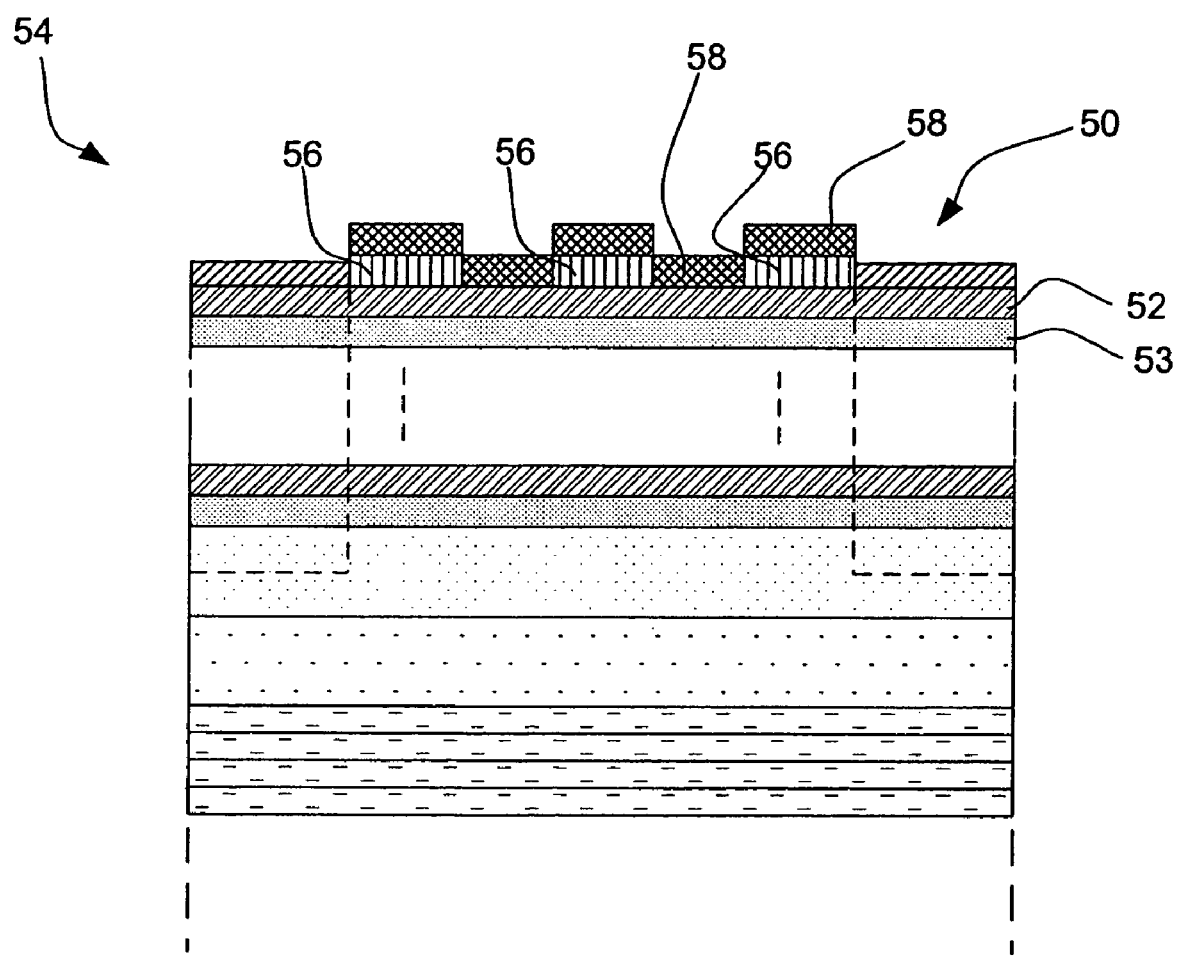
FIG. 2 is a schematic cross-sectional side view of a planar, current-guided, GaAs/AlGaAs top surface emitting vertical cavity laser with a first illustrative resonant reflector for increased mode control in accordance with the present invention.

One illustrative approach for controlling transverse modes of an optoelectronic device is shown in FIG. 2. FIG. 2 is a schematic cross-sectional side view of a planar, current-guided, GaAs/AlGaAs top surface emitting vertical cavity laser, as in FIG. 1, with a top mounted mode control resonant reflector 50. The resonant reflector 50 includes a patterned first material layer 56 that is positioned on top of the top mirror layer 52 of VCSEL 54. A second material layer 58 is provided over the patterned first material layer 56, as shown.

The first material layer 56 preferably has a refractive index that is greater than the refractive index of the second material layer 58, and the first and second material layers 56 and 58 preferably have a refractive index that is less than the refractive index of the top mirror layer 52 of the optoelectronic device 54. In one example, the first material layer 56 is $SiO_2$, the second material layer 58 is $Si_3N_4$ or $TiO_2$, and the top mirror layer 52 is AlGaAs, although other suitable material systems are contemplated. Each layer is preferably an even multiple of one-quarter wavelength (λ/4) thick. This causes a reduction in reflectivity of the resonant reflector 50 in those regions that correspond to the etched regions 60 (see FIG. 3B) in the first material layer 56, that is, those regions that are filled with the second material layer 58. By designing the etched regions to circumscribe the desired optical cavity, this difference in reflectivity can be used to help provide mode control for VCSEL 54.

Figure 3A:
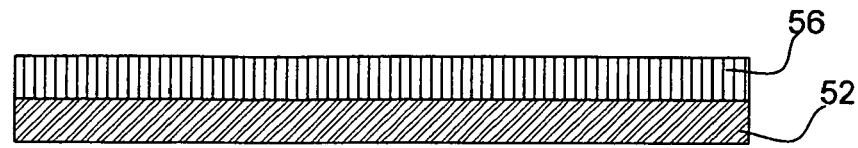
FIGS. 3A-3D are schematic cross-sectional side views showing an illustrative method for making the resonant reflector of FIG. 2.
Figure 3B:
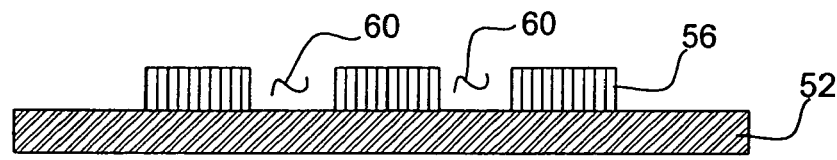
Figure 3C:
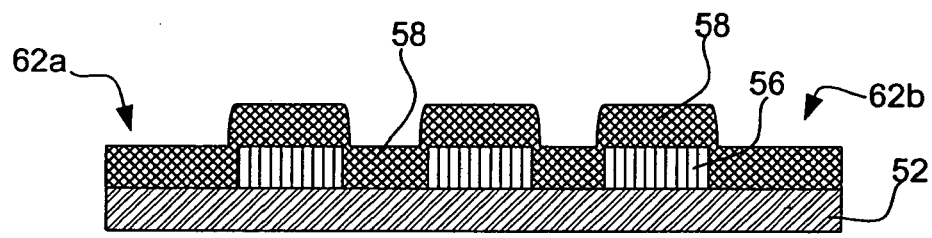
Figure 3D:
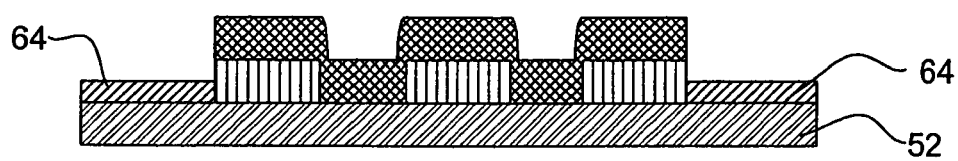

In forming the resonant reflector 50, and referring now to FIG. 3A, the first material layer 56 is provided over the top mirror layer 52. As shown in FIG. 3B, the first material layer 56 is patterned, preferably by etching away the first material layer 56 in the region or regions circumscribing the desired optical cavity of the VCSEL 54. As shown in FIG. 3C, a second material layer 58 is provided over the first material layer 56. The second material layer 58 is preferably provided over both the etched 60 and non-etched regions of the first material layer 56, but may be confined to the non-etched regions if desired. Selected regions, such as regions 62a and 62b of the second material layer 58 may then be removed to provide access to the top mirror layer 52. Then, and as shown in FIG. 3D, a contact layer 64 may be provided on the exposed regions of the top mirror layer 52. The contact layer 64 may provide electrical contact to the top mirror layer 52.

In a related embodiment, a top mirror layer of the optoelectronic device may function as the first material layer 56 discussed above. Thus, the top mirror layer may be patterned, preferably by etching at least partially into the top mirror layer in the region or regions circumscribing the desired optical cavity of the optoelectronic device. In one embodiment, the layer 52 below the top mirror layer may function as an etch stop layer. Then, a second material layer 58 is provided over the top mirror layer. The second material layer is preferably provided over both the etched and non-etched regions of the top mirror layer, but may only be provided over the non-etched regions, if desired. In this embodiment, the regions labeled 56 in FIGS. 2-3 should have the same cross-hatch pattern as layer 53, and the refractive index of these regions should be less than the refractive index of layer 52.

Figure 4:
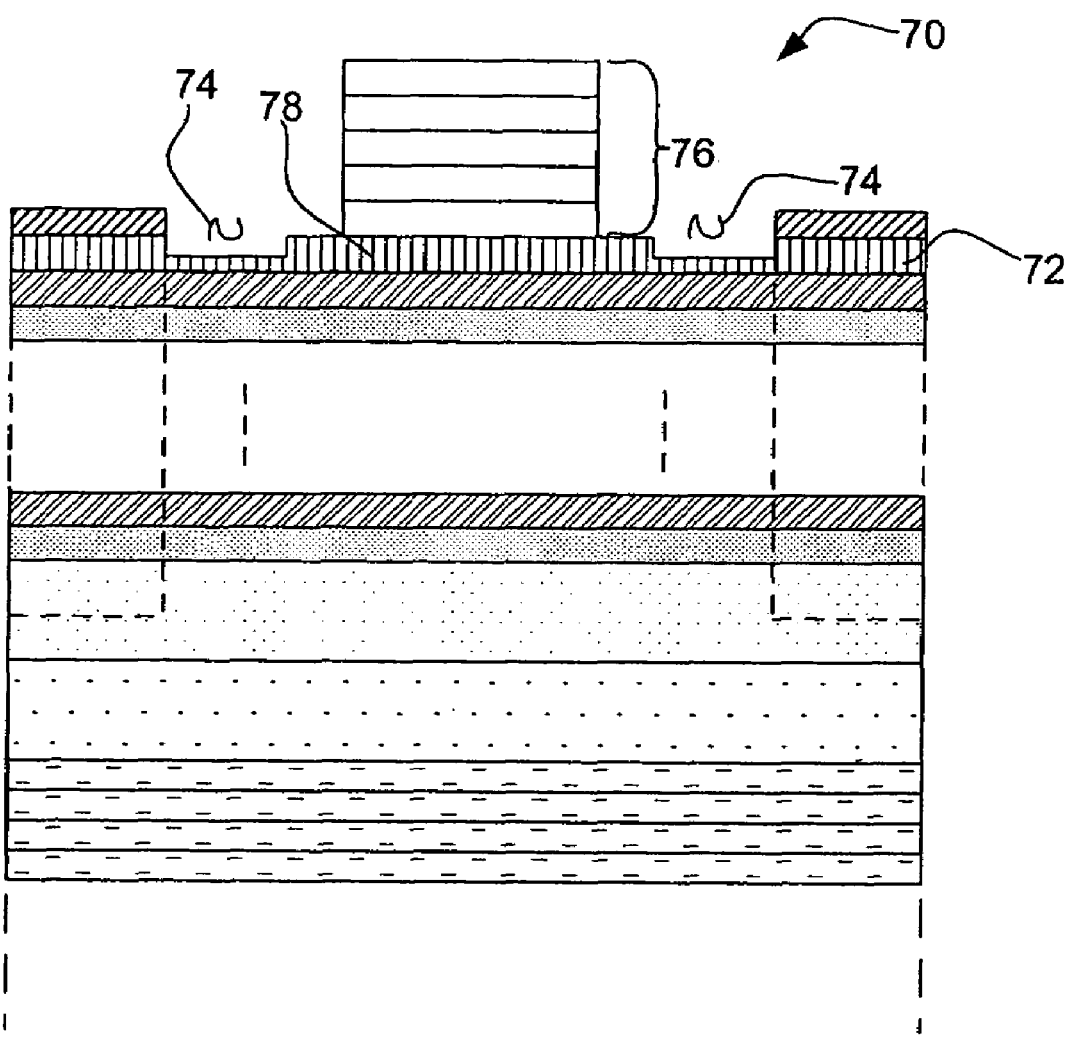
FIG. 4 is a schematic cross-sectional side view of a planar, current-guided, GaAs/AlGaAs top surface emitting vertical cavity laser with a second illustrative resonant reflector for increased mode control in accordance with the present invention.

Another illustrative approach for controlling transverse modes of an optoelectronic device is shown in FIG. 4. FIG. 4 is a schematic cross-sectional side view of a planar, current-guided, GaAs/AlGaAs top surface emitting vertical cavity laser, as in FIG. 1, with another illustrative top mounted mode control resonant reflector 70. In this embodiment, the resonant reflector 70 is formed by etching down into but not all the way through one or more of the top mirror layers 72 of the optoelectronic device. The etched region, generally shown at 74, preferably circumscribes the desired optical cavity of the optoelectronic device, and has a depth that causes a phase shift that reduces the reflectivity of the resonant reflector 70 at the desired operating wavelength, such as a depth that corresponds to an odd multiple of λ/4. To provide further differentiation, a cap mirror 76 having one or more additional layers may be provided on selected non-patterned regions 78 of the top mirror layer 72, such as over the desired optical cavity of the optoelectronic device. The cap mirror 70 may include one or more periods of a conventional semiconductor DBR mirror, or more preferably, a narrow band dielectric reflection filter. A metal layer may be provided on selected regions of the top mirror layer 72. The metal layer may function as a top contact layer.

Figure 5A:
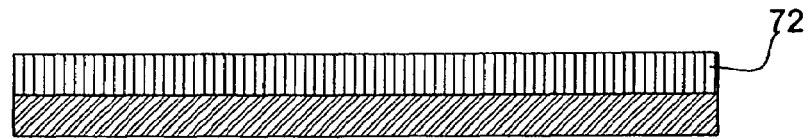
FIGS. 5A-5D are schematic cross-sectional side views showing an illustrative method for making the resonant reflector of FIG. 4.
Figure 5B:
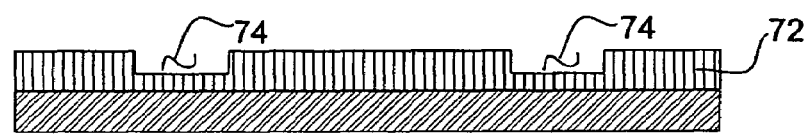

In forming the resonant reflector 70, and referring now to FIGS. 5A-5B, a top mirror layer 72 (or some other top layer) is patterned and etched to form one or more etched regions 74. The etched regions 74 are preferably formed to circumscribe the desired optical cavity of the optoelectronic device. Also, the etched regions 74 are preferably etched down to a depth that causes a phase shift in the incident light, thereby reducing the reflectivity of the resonant reflector 70 in those regions.

Figure 5C:
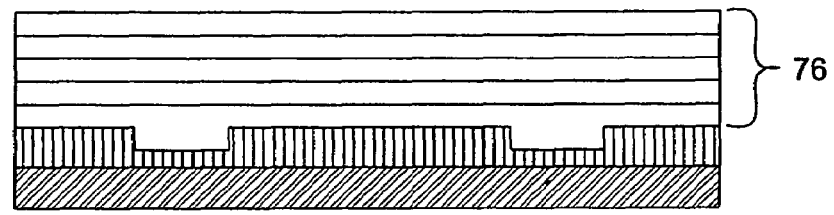
Figure 5D:
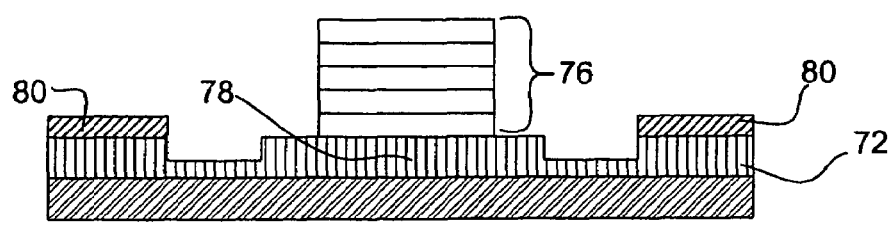

Next, and as shown in FIG. 5C, a cap mirror 76 is formed on the patterned top mirror layer 72. As indicated above, the top mirror layer 72 may include one or more semiconductor DBR mirror periods, and/or a narrow band dielectric reflection filter. In either case, and to provide further differentiation in reflectivity, the cap mirror 76 may be etched away except on those areas that correspond to the desired optical cavity of the optoelectronic device. This is shown in FIG. 5D. Alternatively, the patterned cap mirror 76 may be formed using well known lift-off techniques. Thereafter, a contact layer 80 may be provided on the selected regions of the top mirror layer 72. The contact layer 80 may provide electrical contact to the top mirror layer 72.

Figure 6:
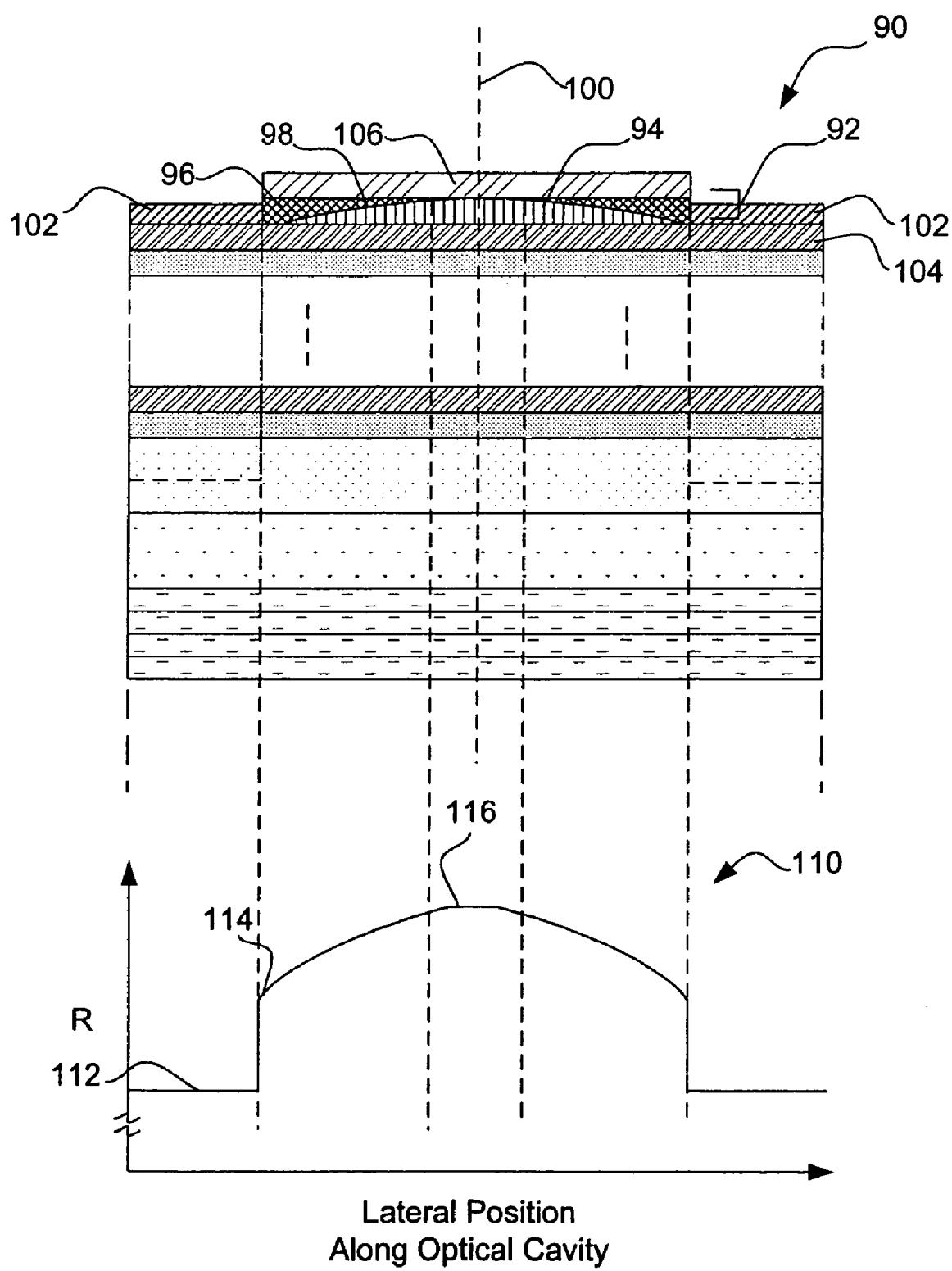
FIG. 6 is a schematic cross-sectional side view of a planar, current-guided, GaAs/AlGaAs top surface emitting vertical cavity laser with yet another illustrative resonant reflector for increased mode control in accordance with the present invention.

Another illustrative approach for controlling transverse modes of an optoelectronic device is shown in FIG. 6. FIG. 6 is a schematic cross-sectional side view of a planar, current-guided, GaAs/AlGaAs top surface emitting vertical cavity laser, as in FIG. 1, with yet another illustrative top mounted mode control resonant reflector 90. In this illustrative embodiment, the resonant reflector 90 has a refractive index that does not abruptly change across the optical cavity of the optoelectronic device.

In a preferred embodiment, the resonant reflector 90 has at least one resonant reflector layer 92 that has a refractive index. The refractive index may include, for example, contributions from both a first material 94 having a first refractive index and a second material 96 having a second refractive index. In a preferred embodiment, the first material 94 is confined to a first region and the second material is confined to a second region, wherein the first region and the second region co-extend along an interface 98. By making the interface 98 non-parallel with the optical axis 100 of the optoelectronic device, the refractive index of the resonant reflector layer, at least when viewed laterally along the optical cavity of the optoelectronic device, does not change abruptly across the optical cavity. Rather, there is a smooth transition from one refractive index to another. This reduces the diffraction effects caused by abrupt changes in the refraction index. It is contemplated that one or more periods of a conventional semiconductor DBR mirror, or more preferably, a narrow band dielectric reflection filter 106, may be provided on top of the resonant reflector 90, as shown. Finally, a contact layer 102 may be provided around the periphery of the optical cavity. In the embodiment shown, the contact layer 102 is in direct contact with the top mirror layer 104 and provides electrical contact to the top mirror layer 104.

The smooth transition from one refractive index to another is further illustrated in chart 110. The X axis of chart 110 represents the lateral position along the optical cavity of the device shown above the chart. The Y axis of chart 110 corresponds to the reflectivity "R" of the top mirror, including the resonant reflector 90 and conventional semiconductor DBR mirror or dielectric reflection filter 106. The reflectivity "R" of the top mirror, at least in the region of the resonant reflector 90, is dependent on the refractive index of the resonant reflector layer 90.

Traveling from left to right laterally along the optical cavity of the optoelectronic device, the reflectivity starts at a first value 112. The first value 112 is shown relatively low because the resonant reflector 90 and the conventional semiconductor DBR mirror or dielectric reflection filter 106 do not extend out into this region. The contact layer 102 may also decrease the reflectivity in this region.

At the edge of the resonant reflector 90, the reflectivity increases to a value 114, which includes contributions from the second material 96 of the resonant reflector layer 90 and the conventional semiconductor DBR mirror or dielectric reflection filter 106. Moving further to the right, the refractive index of the resonant reflector 90 begins to change due to the relative contributions of the first material 94 and the second material 96. This causes the reflectivity of the resonant reflector 90 to smoothly increase toward the center of the desired optical cavity, as shown. Preferably, the reflectivity of the resonant reflector 90 reaches a maximum 116 in or around the center of the desired optical cavity. The reflectivity of the resonant reflector 90 then decreases to the right of the center of the desired optical cavity, in an opposite manner to that described above. As can be seen, the refractive index, and thus the reflectivity, of the resonant reflector 90 does not change abruptly across the optical cavity. Rather, there is a smooth transition from one refractive index to another. This reduces the diffraction effects often caused by abrupt changes in the refraction index of a resonant reflector.

FIGS. 7A-7D are schematic cross-sectional side views showing a first illustrative method for making the resonant reflector of FIG. 6. In this illustrative embodiment, a first substantially planar layer of material 94 is provided on, for example, a top mirror layer 104 of a conventional DBR mirror. The top mirror layer 104 preferably has a refractive index that is higher than the refractive index of the first layer of material 94. The top mirror layer 104 may be, for example, AlGaAs, and the first layer of material 94 may be, for example, TiO2, Si3N4, or a polymer such as polyamide or Benzocyclobuthene (BCB).

Figure 7A:
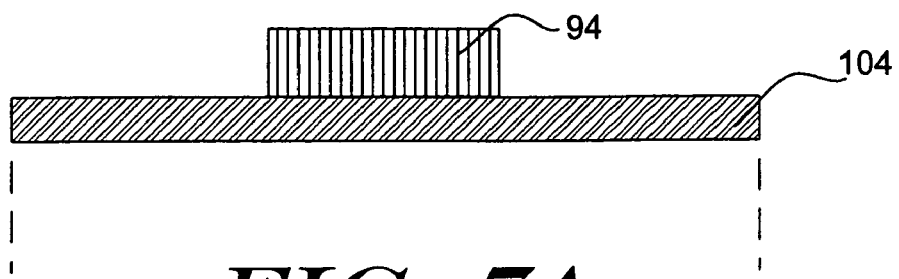
FIGS. 7A-7D are schematic cross-sectional side views showing a first illustrative method for making the resonant reflector of FIG. 6.
Figure 7B:
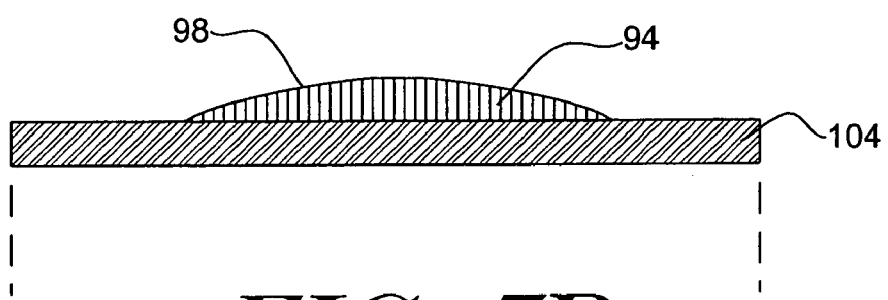
Figure 7C:
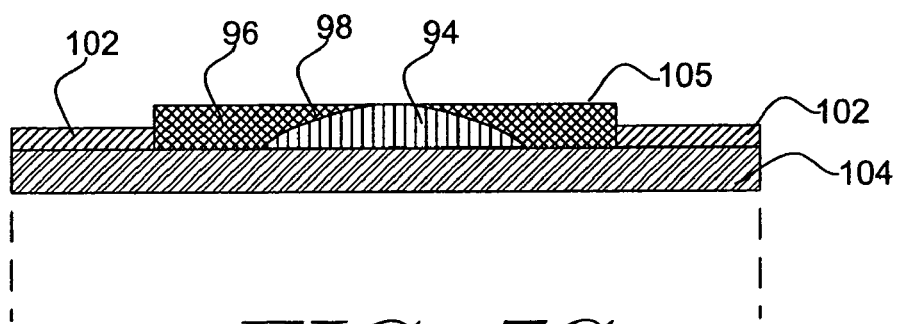

The first layer of material is then patterned, as shown in FIG. 7A. This is typically done using a conventional etch process. As shown in FIG. 7B, the patterned first layer of material 104 is then heated, which causes it to reflow. This results in a non-planar top surface 98. Then, and as shown in FIG. 7C, a second layer of material 96 is provided over the first layer of material 94. The top surface 105 of the second layer of material 96 is preferably substantially planar, but it may be non-planar if desired. The second layer of material 96 preferably has a refractive index that is lower than the refractive index of the first layer of material 94. The second layer of material 96 may be, for example, SiO2, a polymer, or any other suitable material. When desired, the top surface 105 of the second layer of material 96 may be planarized using any suitable method including, for example, reflowing the second layer of material 96, mechanical, chemical or chemical-mechanical polishing (CMP) the second layer of material 96, etc. In some embodiments, the top surface 105 is left non-planar.

Figure 7D:
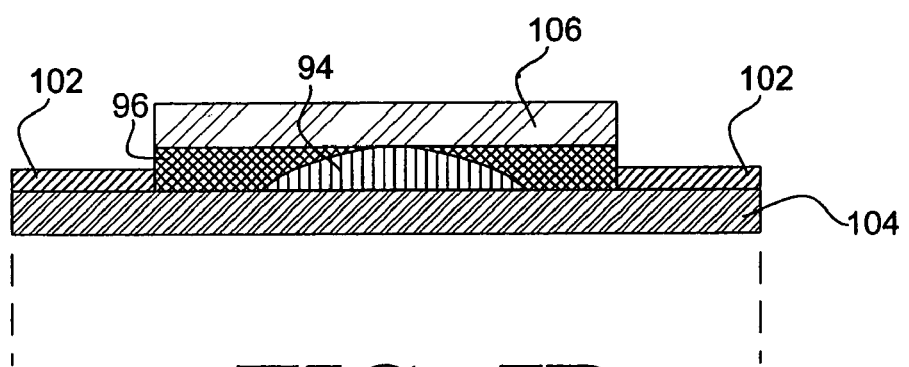

The second layer of material 96 is preferably provided over the entire top surface of the resonant reflector, and etched away in those regions where a top contact 102 is desired. Once the second layer of material 96 is etched, a contact layer 102 is provided on the exposed regions of the top mirror layer 104. The contact layer 102 provides electrical contact to the top mirror layer 104. As shown in FIG. 7D, a cap mirror 106 may then be provided above the second layer of material 96. The cap mirror 106 may include one or more periods of a conventional semiconductor DBR mirror, or more preferably, a narrow band dielectric reflection filter.

Figure 8A:
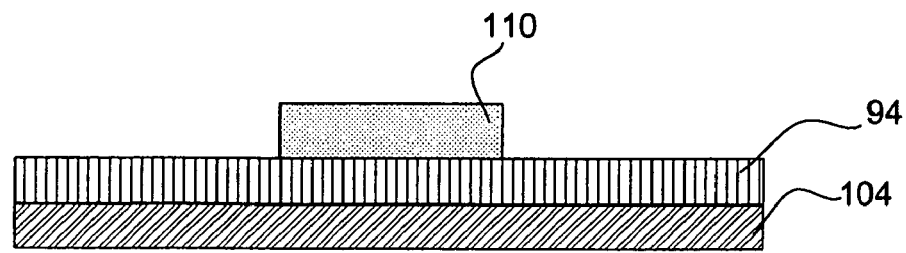
FIGS. 8A-8E are schematic cross-sectional side views showing another illustrative method for making the resonant reflector of FIG. 6.

FIGS. 8A-8E are schematic cross-sectional side views showing another illustrative method for making the resonant reflector of FIG. 6. In this illustrative embodiment, and as shown in FIG. 8A, a first substantially planar layer of material 94 is provided on, for example, a top mirror layer 104 of a conventional DBR mirror. The top mirror layer 104 preferably has a refractive index that is higher than the refractive index of the first layer of material 94. The top mirror layer 104 may be, for example, AlGaAs, and the first layer of material 94 may be, for example, TiO2, Si3N4, or any other suitable material. Next, a photoresist layer 110 is provided and patterned on the first layer of material 94, preferably forming an island of photoresist above the desired optical cavity of the optoelectronic device.

Figure 8B:
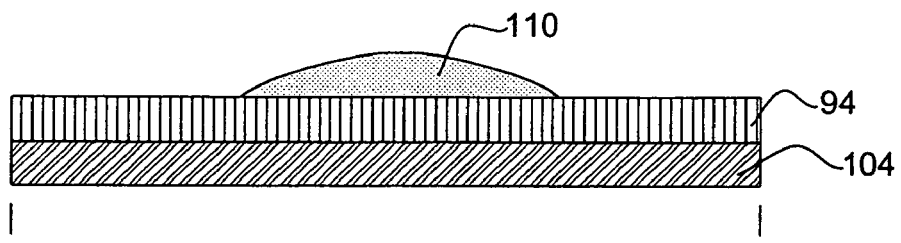
Figure 8C:
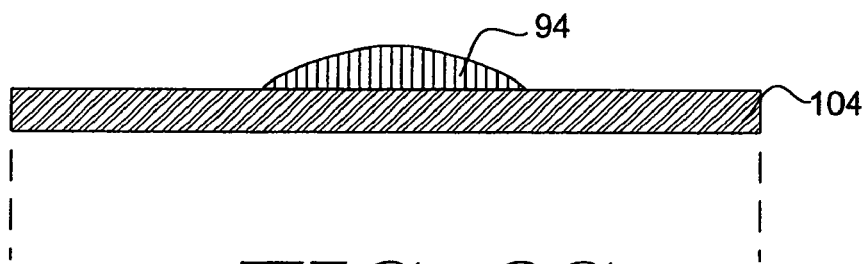

As shown in FIG. 8B, the photoresist layer 110 is then heated, causing it to reflow. This results in a non-planar top surface on the photoresist layer 110. That is, the top surface of the photoresist layer 110 may have portions that taper down toward the first layer of material 94. Next, and as shown in FIG. 8C, the photoresist layer 110 and the first layer of material 94 are etched for a specified period of time. The etchant preferably selectively etches both the photoresist layer 110 and the first layer of material 94. This transfers the shape of the non-planar top surface of the photoresist layer 110 to the first layer of material 94.

Figure 8D:
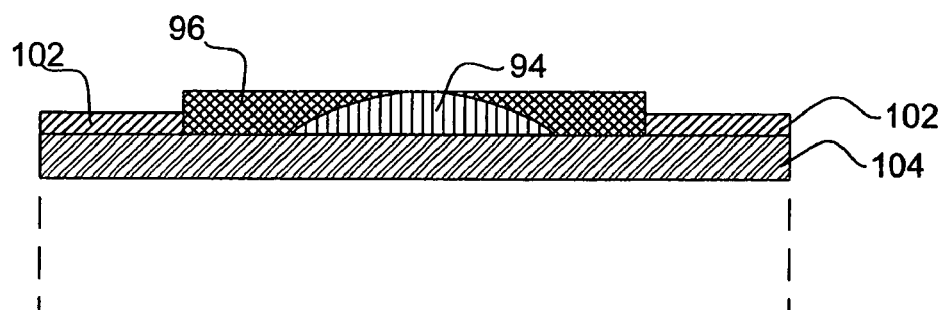
Figure 8E:
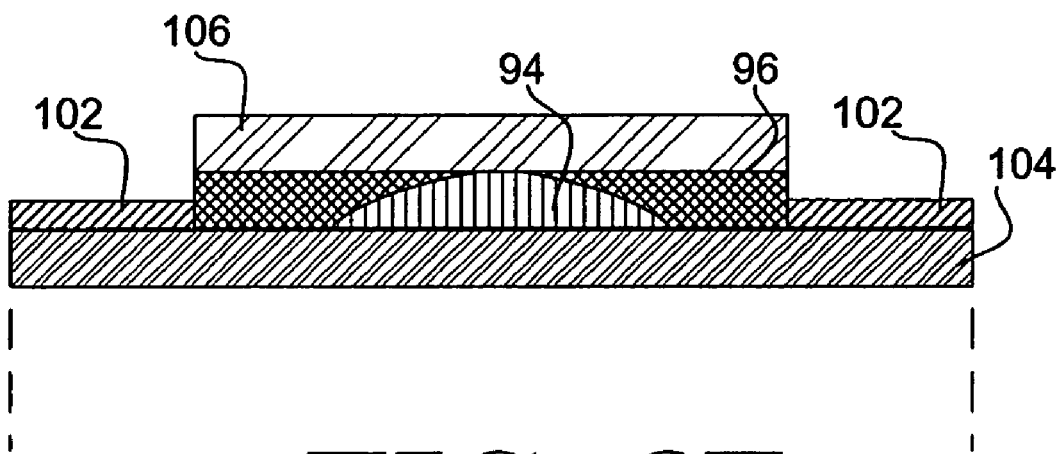

As shown in FIG. 8D, a second layer of material 96 is then provided over the first layer of material 94. The second layer of material 96 preferably has a refractive index that is less than the refractive index of the first layer of material 94. The second layer of material 96 is preferably provided over the entire top surface of the resonant reflector, and etched away in those regions where a top contact 102 is desired. Once the second layer of material 96 is etched, a contact layer 102 is provided on the exposed regions of the top mirror layer 104. The contact layer 102 provides electrical contact to the top mirror layer 104. Preferably, the top surface of the second layer of material 96 is substantially planar. As shown in FIG. 8E, a cap mirror 106 may be provided above the second layer of material 96, if desired. The cap mirror 106 may include one or more periods of a conventional semiconductor DBR mirror, or more preferably, a narrow band dielectric reflection filter.

Figure 9A:
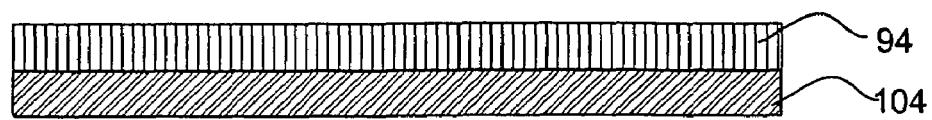
FIGS. 9A-9E are schematic cross-sectional side views showing yet another illustrative method for making the resonant reflector of FIG. 6.

FIGS. 9A-9E are schematic cross-sectional side views showing yet another illustrative method for making the resonant reflector of FIG. 6. In this illustrative embodiment, and as shown in FIG. 9A, a first substantially planar layer of material 94 is provided on, for example, a top mirror layer 104 of a conventional DBR mirror. Like above, the top mirror layer 104 preferably has a refractive index that is higher than the refractive index of the first layer of material 94.

Figure 9B:
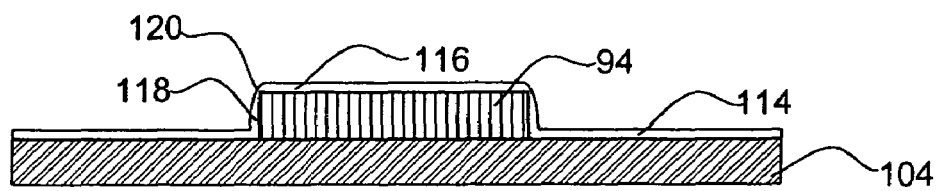

Next, and as shown in FIG. 9B, the first layer of material 94 is patterned, preferably forming an island above the desired optical cavity of the optoelectronic device. This results in the first layer of material 94 having lateral surfaces 118 that extend up to a top surface 116 that is defined by top peripheral edges 120. A photoresist layer 114 is then provided over the patterned first layer of material 94, including over the lateral surfaces 118, the top peripheral edges 120 and the top surface 116. Because of the step between the top surface 116 and the lateral surfaces 118, the photoresist layer 114 is thinner near the top peripheral edges 120 than along either the lateral surfaces 118 or top surface 116 of the patterned first layer of material 94, as shown.

Figure 9C:
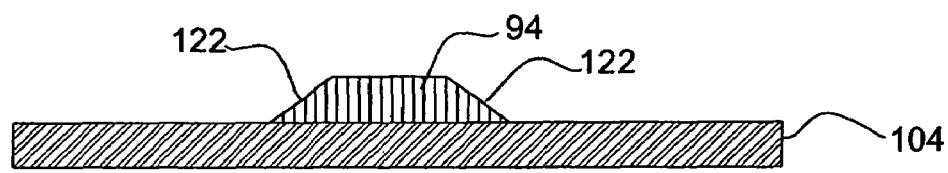

As shown in FIG. 9C, the photoresist layer 114 and the first layer of material 94 are then etched for a specified period of time. During this etch step, those regions of the first layer of material 94 that are adjacent the thinner regions of the photoresist layer 114 are subject to the etchant for a longer period of time than those regions that are adjacent thicker regions of the photoresist layer 114. Thus, and as shown in FIG. 9C, the top peripheral edges 120 of the first layer of material 94 are etched more than those regions away from the top peripheral edges 120, resulting in tapered edges 122.

Figure 9D:
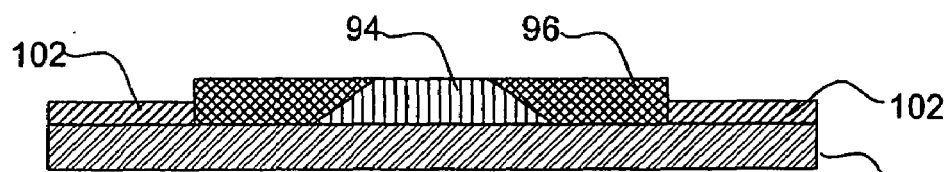

After the etching step, and as shown in FIG. 9D, a second layer of material 96 may be provided over the first layer of material 94. Like above, the second layer of material 96 preferably has a refractive index that is less than the refractive index of the first layer of material 94. The second layer of material 96 is preferably provided over the entire top surface of the resonant reflector, and etched away in those regions where a top contact 102 is desired. Once the second layer of material 96 is etched, a contact layer 102 is provided on the exposed regions of the top mirror layer 104. The contact layer 102 provides electrical contact to the top mirror layer 104. Preferably, the top surface of the second layer of material 96 is substantially planar.

Figure 9E:
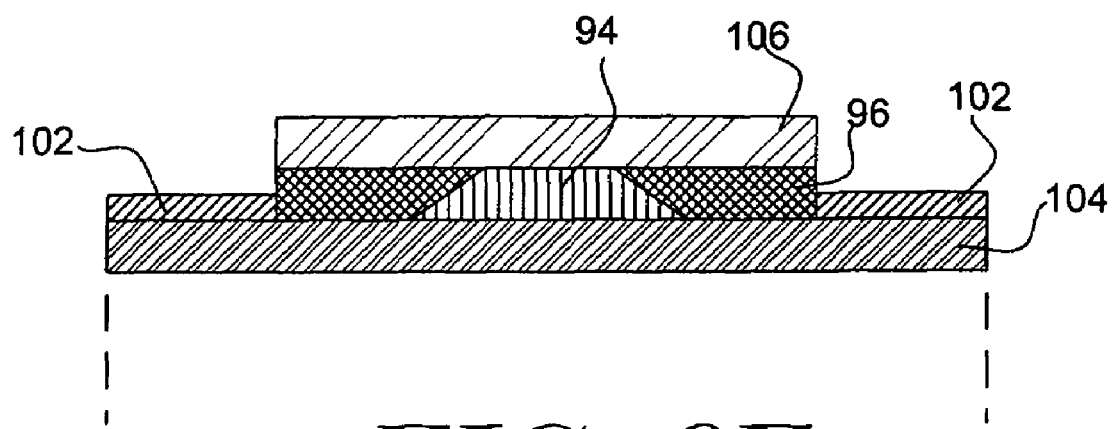

As shown in FIG. 9E, a cap mirror 106 may be provided above the second layer of material 96, if desired. The cap mirror 106 may include one or more periods of a conventional semiconductor DBR mirror, or more preferably, a narrow band dielectric reflection filter.

Figure 10:
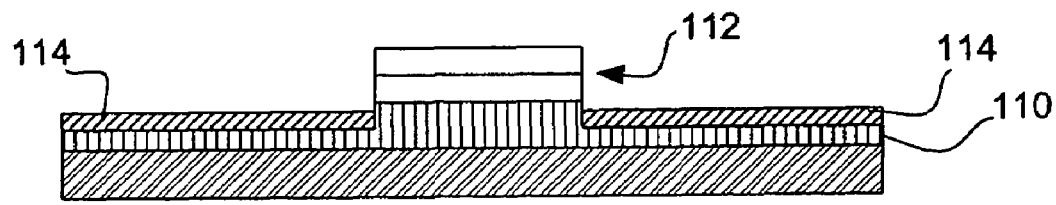
FIG. 10 is a schematic cross-sectional side view showing another illustrative embodiment of the present invention similar to that shown in FIGS. 5A-5D.

FIG. 10 is a schematic cross-sectional side view showing another illustrative embodiment of the present invention similar to that shown in FIGS. 5A-5D. In this embodiment, a top layer 110, which may be the top mirror layer of the top DBR mirror stack of the optoelectronic device or an additional layer on top of the top mirror layer, may be etched down—but not all the way through. The etched region preferably circumscribes the desired optical cavity of the optoelectronic device, and has a depth that causes a phase shift that reduces the reflectivity of the resonant reflector at the desired operating wavelength, such as a depth that corresponds to an odd multiple of $\lambda/4$. Like in FIGS. 5A-5D, a cap mirror 112 having one or more additional layers may be provided on selected non-patterned regions of layer 110, such as over the desired optical cavity of the optoelectronic device, to provide further differentiation in reflectivity. A metal layer 114 may then be provided on the etched region of layer 110. The metal layer may function as the top contact. By extending the metal layer 114 all the way or near the cap mirror 112, better current spreading can be achieved for the optoelectronic device.

Figure 11:
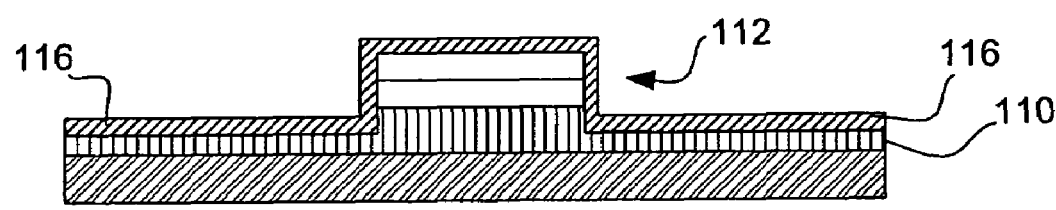
FIG. 11 is a schematic cross-sectional side view showing another illustrative embodiment of the present invention similar to that shown in FIGS. 5A-5D.

FIG. 11 is a schematic cross-sectional side view showing another illustrative embodiment of the present invention similar to that shown in FIGS. 5A-5D. This embodiment is similar to that of FIG. 10, but the metal layer, now labeled 116, extends over the etched region of layer 110 and over the cap mirror 112. For back illumination devices, this may provide even better current spreading for the optoelectronic device.

Figure 12:
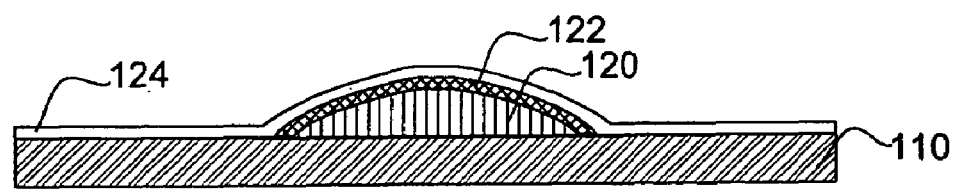
FIG. 12 is a schematic cross-sectional side view showing another illustrative embodiment of the present invention similar to that shown in FIGS. 8A-8E.

FIG. 12 is a schematic cross-sectional side view showing another illustrative embodiment of the present invention similar to that shown in FIGS. 8A-8E. A resonant reflector is provided that has a refractive index that does not change abruptly across the optical cavity of the optoelectronic device. The illustrative resonant reflector includes at least one resonant reflector layer that has a refractive index that includes contributions from, for example, both a first material 120 having a first refractive index and a second material 122 having a second refractive index. In the embodiment shown, the first material 120 is confined to a first region and the second material 122 is confined to a second region, wherein the first region and the second region co-extend along an interface. A metal layer 124 is then provided over the entire structure. For back illumination devices, the metal layer 124 may provide enhanced current spreading when compared to the device shown in FIGS. 8A-8E.

Having thus described the preferred embodiments of the present invention, those of skill in the art will readily appreciate that the teachings found herein may be applied to yet other embodiments within the scope of the claims hereto attached.

What is claimed is:

1. A method for forming a resonant reflector on a top layer of an optoelectronic device, the method comprising:

depositing a first material layer on the top layer of the optoelectronic device, the first material layer having a first refractive index and a thickness of about an odd multiple of a quarter of a wavelength to which the optoelectronic device is tuned, wherein the first material layer comprises a top mirror layer of a DBR mirror;

creating at least one patterned region that extends at least partially into the first material layer, the thickness of the first material layer being reduced in the at least one patterned region;

filling, partially at least, at least one selected patterned region with a second material having a second refractive index, one of the first and second refractive indices being greater than the other of the first and second refractive indices; and depositing a third layer immediately adjacent the first material layer, the third layer having a refractive index greater than the refractive index of the first material layer.

2. The method as recited in claim 1, wherein the at least one patterned region is created by etching.

3. The method as recited in claim 1, wherein at least one of the patterned regions extends completely through the first material layer.

4. The method as recited in claim 1, wherein the second refractive index is greater than the first refractive index.

5. The method as recited in claim 1, wherein the second material has a thickness of about an odd multiple of a quarter of the wavelength to which the optoelectronic device is tuned.

6. The method as recited in claim 1, wherein the second material also extends over at least one non-patterned region of the first material layer.

7. The method as recited in claim 1, wherein the at least one patterned region is configured such that reflectivity of the resonant reflector is reduced in the at least one patterned region.

8. The method as recited in claim 1, wherein the at least one patterned region is configured and arranged to facilitate mode control for the optoelectronic device.

9. The method as recited in claim 1, wherein the first material substantially comprises $SiO_2$, the second material substantially comprises $Si_3N_4$ or $TiO_2$, and the third material substantially comprises AlGaAs.

10. The method as recited in claim 1, further comprising removing a region of the second material to provide access to a top mirror layer of the optoelectronic device.

11. The method as recited in claim 10, further comprising providing a contact layer on the exposed region of the top mirror layer.

12. The method as recited in claim 1, wherein the patterned region circumscribes a desired optical cavity of the optoelectronic device.

13. A method for forming a resonant reflector on a top layer of an optoelectronic device, the method comprising:

depositing a first material layer on the top layer of the optoelectronic device, the first material layer having a first refractive index and a thickness of about an odd multiple of a quarter of a wavelength to which the optoelectronic device is tuned;

creating at least one patterned region that extends at least partially into the first material layer, the thickness of the first material layer being reduced in the at least one patterned region;

filling, partially at least, at least one selected patterned region with a second material having a second refractive index, one of the first and second refractive indices being greater than the other of the first and second refractive indices; and depositing a third layer immediately adjacent the first material layer, the third layer having a refractive index greater than the refractive index of the first material layer, wherein the first and second material layers have a refractive index that is less than a refractive index of a top mirror layer of the optoelectronic device.

14. The method as recited in claim 13, wherein the top mirror layer comprises AlGaAs.

15. A method for forming a resonant reflector on a top layer of an optoelectronic device, the method comprising:

depositing a first material layer on the top layer of the optoelectronic device, the first material layer having a first refractive index and a thickness of about an odd multiple of a quarter of a wavelength to which the optoelectronic device is tuned;

creating at least one patterned region that extends at least partially into the first material layer, the thickness of the first material layer being reduced in the at least one patterned region;

filling, partially at least, at least one selected patterned region with a second material having a second refractive index, one of the first and second refractive indices being greater than the other of the first and second refractive indices; and depositing a third layer immediately adjacent the first material layer, the third layer having a refractive index greater than the refractive index of the first material layer, wherein the first material layer is a top mirror layer of the optoelectronic device.

16. The method as recited in claim 15, wherein the at least one patterned region is created in the first material layer by etching.

17. The method as recited in claim 16, wherein a layer below the top mirror layer functions as an etch stop layer.

* * * * *